United States Patent [19]
Wolfram

[11] 4,145,659
[45] Mar. 20, 1979

[54] UHF ELECTRONIC TUNER

[75] Inventor: Adolf E. Wolfram, Portsmouth, Va.

[73] Assignee: General Electric Company, Portsmouth, Va.

[21] Appl. No.: 800,422

[22] Filed: May 25, 1977

[51] Int. Cl.² .......................................... H04B 1/26
[52] U.S. Cl. .................................. 325/468; 325/462; 334/15; 334/45
[58] Field of Search ............... 325/373, 376, 379, 383, 325/386, 452, 458, 459, 461, 462, 464, 465, 468, 489, 490; 334/15, 42, 45; 333/70 S, 73 R, 73 S, 76

[56] References Cited

U.S. PATENT DOCUMENTS

| | | | |
|---|---|---|---|
| 2,964,626 | 12/1960 | Webster et al. | 325/468 |
| 3,391,347 | 7/1968 | Bosse et al. | 330/31 |
| 3,508,177 | 4/1970 | Suzuki | 334/15 |
| 3,573,683 | 4/1971 | Marshall et al. | 334/15 |
| 3,649,937 | 3/1972 | Carlson | 334/15 |
| 3,651,409 | 3/1972 | George et al. | 325/462 |
| 3,727,140 | 4/1973 | Nieto et al. | 325/458 |

FOREIGN PATENT DOCUMENTS

| | | | |
|---|---|---|---|
| 565227 | 10/1958 | Canada | 334/42 |
| 1263877 | 3/1968 | Fed. Rep. of Germany | 334/15 |
| 1209609 | 10/1970 | United Kingdom | 334/15 |

*Primary Examiner*—Robert L. Griffin
*Assistant Examiner*—Marc E. Bookbinder

[57] ABSTRACT

A high input selectivity UHF varactor tuner for a television receiver in which unamplified radio frequency signals are inductively coupled to a double tuned half-wave preselector comprising two aperture coupled half-wave tuned lines in separate resonant cavities. The double tuned preselector includes varactor diodes on one end of each tuned line and fixed capacitors on the other end of each line. To compensate for decreasing Q of the varactor diodes with decreasing frequency and thereby maintain a uniform bandwidth for the tuner over the entire UHF spectrum, inductive coupling is provided between the tuned lines at the fixed capacitor ends which, during low frequency operation of the tuner, augments aperture coupling between the lines.

12 Claims, 1 Drawing Figure

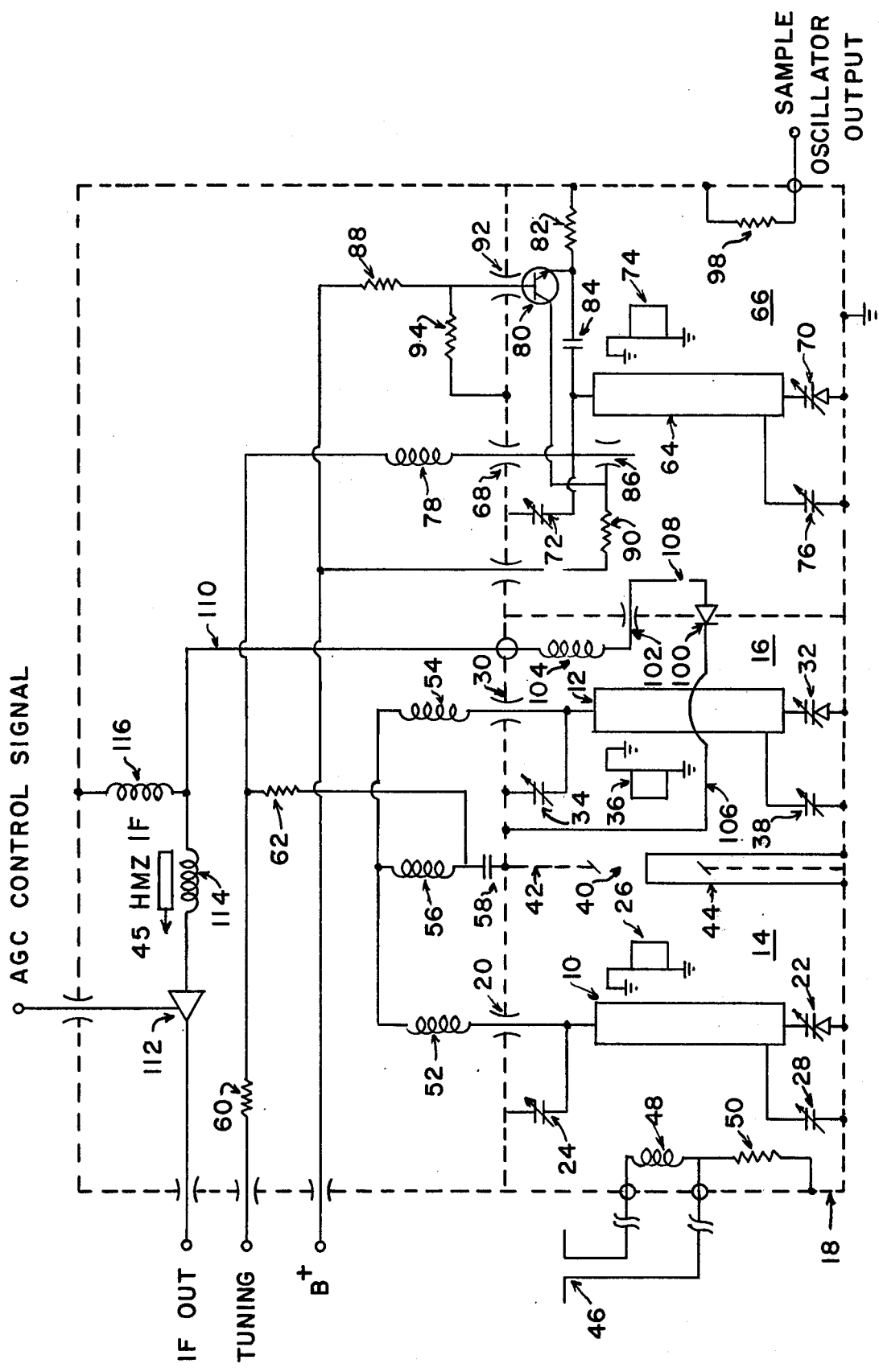

UHF ELECTRONIC TUNER

BACKGROUND OF THE INVENTION

The present invention relates to a UHF tuner employing varactor diodes and half-wave tuned lines in a manner which results in a substantially uniform bandwidth over the entire UHF spectrum.

Conventional UHF tuners for use in commercially available television receivers comprise several stages: a broadly single tuned preselector, a radio frequency preamplifier to amplify the broadly tuned incoming radio frequency signals, a double tuned interstage following the preamplifier tuned to peak at one select radio frequency signal, an oscillator to generate an oscillator signal, and a mixer to heterodyne the oscillator signal with the select radio frequency signal to result in an intermediate frequency signal. The resultant intermediate frequency signal is usually applied to the VHF turner and from the VHF tuner the signal is fed into the intermediate stage of a television receiver for further processing in the same manner all VHF signals are processed for reduction to video and audio information.

The radio frequency preamplifiers of the prior art UHF tuners are prone to poor input selectivity resulting in a tendency to cross modulate. In addition, automatic gain control in UHF radio frequency preamplifiers varies considerably with frequency resulting in a limited dynamic range or signal handling capability.

The preselector of prior art UHF tuners typically employs some form of resonant cavity which, in essence, is a space enclosed by conducting walls. The cavity has a resonant frequency defined by the modes of electrical fields which can be sustained in that space. The fundamental resonant frequency of a cavity is thus determined by the physical dimensions and configurations of the cavity's walls which act, in effect, as the outer conductor of a coaxial line. In the alternative, substrates and strip lines may be employed to establish the fundamental resonant frequency of the preselector.

Power is coupled to a tuned line mounted inside the cavity in either a quarter-wave ($\lambda/4$) or half-wave ($\lambda/2$) tuning mode. In the quarter-wave mode, one end of the tuned line is shorted directly to the cavity walls while the other end of the tuned line is capacitively coupled to the cavity walls. Accordingly, a null or low impedance point develops at the shorted end and a peak or high impedance point develops at the other end of the tuned line forming a quarter-wave standing wave. In a half-wave mode, both ends of the tuned line are capacitively coupled to the cavity walls resulting in peaks being developed at each end of the tuned line and a null or low impedance point developed at the node intermediate the ends of the tuned line thereby forming a half-wave standing wave. In the same manner, quarter-wave and half-wave tuning can be established in preselectors using strip line design.

In any case, the resonant frequency of the line is controlled or tuned by varying the capacitance used to couple the tuned line to the cavity walls. With quarter-wave tuning, varying the value of the capacitance varies the resonant frequency of the line, however, the high impedance point remains fixed at the end of the line capacitively coupled to the cavity walls. With half-waves tuning, varying the value of the capacitance also varies the resonant frequency of the line, but the node shifts along the line dependent on the relative values of the capacitors at each end of the line. Furthermore, a higher impedance point is developed at the lower capacitance of the two capacitors.

There are two fundamental types of variable capacitors used to vary the frequency of tuned lines in UHF tuners. The first type is a mechanical, air dielectric, design wherein the position of metal plates is altered relative to each other to vary the capacitance of the device. The second type is an electric, varactor diode, design wherein the capacitance of the diode varies inversely with the magnitude of reverse bias placed across the diode.

The use of varactor diodes in UHF tuners has a major advantage over mechanical capacitors in that varactor diodes permit UHF stations to be selected easily by means of an electric rotary switch or push buttons. Varactor diodes also render easy tuning to UHF stations by remote control.

There is, however, a major disadvantage in the use of varactor diodes in UHF tuners. Specifically, a varactor diode exhibits a decreasing Q, a figure of merit of an electrical circuit, as the capacitance of the varactor diode increases. Thus, when used in a tuned circuit of a UHF tuner, varactor diodes cause a decrease in the Q and consequently a decrease in the overall quality of the tuner at the low end of the UHF frequency spectrum when the capacitance of the varactor diode is at a maximum. The decrease of Q in a tuned circuit has the specific disadvantage of increasing the bandwidth of that tuned circuit proportional to the decrease in the Q of the circuit.

To compensate for the varying Q factor, a tuned circuit using a varactor diode can be damped, for example, by utilizing a frequency-dependent resistor to load a tuned circuit at the high end of a frequency range, as is taught by U.S. Pat. No. 3,573,683 issued to Marshall et al on Apr. 6, 1971. However, commercially acceptable UHF tuners employing varactor diodes generally compensate for the decreased Q and resultant overall loss in the tuned circuits at low frequencies by providing a radio frequency preamplifier in front of the UHF double tuned interstage to assure sufficient signal strength over the entire UHF frequency spectrum, but even so, in such tuners there is no compensation for losses incurred in the input preselector stage.

For quarter-wave tuners, the preamplifier can be an FET variety which has a high impedance output and can readily be coupled to the non-shifting, high impedance end of quarter-wave tuned line. However, the state of the art UHF FET devices at present exhibit limited gain control capability and as a consequence cause overload problems in high gain tuners. For half-wave tuners, the preamplifier can be a bipolar variety which has a low output impedance and can be coupled at a fixed capacitor of a half-wave tuned line which over at least a portion of the frequency spectrum exhibits a low impedance. However, in the case of a bipolar gain controlled preamplifier, radio frequency cross modulation can become a problem. In both cases, the radio frequency amplifiers exhibit shortcomings which force compromise in various performance parameters and require additional expense including the need for interface components.

The present invention overcomes these disadvantages of the prior art by employing a double tuned preselector circuit in front of the first non-linear device to achieve optimum UHF tuner selectivity. The double tuned preselctor circuit configuration compensates for the varying Q factor in a manner which allows for large signal handling capability with no UHF radio frequency preamplifier. Instead, a post intermediate frequency gain controlled amplifier allows for frequency independent gain control operation in which the VHF tuner and UHF tuner automatic gain control signals can be derived from the same source without interface.

It is accordingly an object of the present invention to provide an optimum input selectivity UHF varactor tuner with a substantially constant bandwidth over the entire UHF spectrum.

It is another object of the present invention to provide a UHF tuner using varactor diodes which exhibits a uniform bandwidth across the entire UHF spectrum.

It is a further object of the present invention to provide a UHF varactor tuner with a constant bandwidth across the entire UHF spectrum, and which does not require radio frequency preamplification of an incoming UHF signal.

A still further object of the present invention is to provide a UHF varactor tuner with large dynamic range and automatic gain control independent of UHF signal level and frequency selection.

SUMMARY OF THE INVENTION

To achieve the foregoing objects and in accordance with the purposes of the invention, as embodied and broadly described herein, the UHF tuner of this invention comprises a preselector for passing a select radio frequency signal which has a plurality of tuned transmission lines and a plurality of varactor diodes for providing variable half-wave tuning of the transmission lines. An oscillator generates an oscillator signal and a mixer is coupled to heterodyne the oscillator signal with the select radio frequency signal to result in an intermediate frequency signal. In addition, a circuit is provided to enhance radio frequency coupling between the tuned transmission lines at lower frequencies of the UHF spectrum and thereby compensate for decreasing Q of the circuit caused by low frequency, high capacitance, operation of the varactor diodes.

In a preferred embodiment of the invention, the preselector includes two half-wave transmission lines each housed in an individual one of first and second preselector resonant cavities with each transmission line coupled at one end to the walls of its cavity by a capacitor and at the other end each transmission line is coupled to the walls of its cavity by a varactor diode. Aperture coupling is provided between the two preselector cavities and reverse bias is applied to the varactor diodes to control the capacitance of the varactor diodes and thereby double tune the preselector to a desired resonant frequency. In this embodiment of the invention, inductive coupling is provided between the two ends of the transmission lines which are connected to the capacitors. During low frequency operation, the capacitance of the capacitors is much less than the capacitance of the varactor diodes causing the higher impedance point of the half-wave lines to develop at the capacitors. This development of high impedance at the capacitors both minimizes the effect of the decreasing Q of the varactor diodes on the overall circuit and renders effective the inductive coupling between the transmission lines to augment the aperture coupling between the lines and maintain a substantially constant bandwidth and high Q over the entire UHF spectrum.

It is also preferred that unamplified radio frequency signals from a UHF antenna are coupled to the double tuned lines of the preselector to provide optimum input selectivity in front of the first non-linear device of the tuner. In addition, a low noise post intermediate frequency gain control amplifier is coupled to control the magnitude of the intermediate frequency signal from the mixer for application of the controlled intermediate frequency signal to an intermediate frequency signal input of a VHF tuner.

DESCRIPTION OF THE DRAWING

A greater appreciation of the objects and advantages of the invention may be understood by a detailed description taken in conjunction with the drawing wherein a schematic diagram of a preferred embodiment of the invention is illustrated.

DETAILED DESCRIPTION

Reference will now be made in detail to the present preferred embodiment of the invention, an example of which is illustrated in the accompanying drawing.

Referring now to the drawing, a double tuned half-wave preselector stage of a varactor tuner is shown in accordance with the present invention as comprising first and second tuned transmission lines 10 and 12 mounted in first and second resonant cavities 14 and 16 defined by conductive walls of a housing 18. Tuned transmission lines 10 and 12 may, for example, comprise bars, strips, wires or other conductive materials capable of setting up standing waves in the UHF radio frequency spectrum. Transmission line 10 is connected to resonant cavity 14 in a half-wave mode with both ends capacitively coupled to cavity 14. Specifically, one end of transmission line 10 is coupled to the walls of cavity 14 by a fixed capacitor 20. Fixed capacitor 20 is preferably of a feed-through variety which allows for DC coupling to transmission line 10 while simultaneously providing AC coupling of transmission line 10 to housing 18.

The other end of transmission line 10 is coupled to the walls of resonant cavity 14 by varactor diode 22. Varactor diode 22 is a voltage variable capacitor which exhibits a capacitance when reversed biased with a DC potential. As the reverse bias across the varactor diode increases, the capacitance of the varactor diode decreases and as the reverse bias across the varactor diode decreases the capacitance of the varactor diode increases.

In addition to transmission line 10, feed-through capacitor 20 and varactor diode 22, resonant cavity 14 houses trimmer capacitors 24, 26 and 28. In a preferred embodiment of the invention, trimmer capacitor 24 comprises a physically adjustable metallic plate connected to one end of transmission line 10 with the plate located adjacent the housing 18 to form capacitance coupling with the housing. Geometric variations in the plate configuration respective housing 18 adjust the magnitude of the coupling. In a preferred embodiment, trimmer capacitors 26 and 28 comprise metallic plates coupled to housing 18 and are physically located along transmission line 10 to form capacitive coupling with line 10.

In a similar manner, second transmission line 12 is connected to resonant cavity 16 in a half-wave mode with both ends capacitively coupled to the walls of second resonant cavity 16. Specifically, transmission line 12 is coupled to the walls of cavity 16 at one end by a fixed capacitor 30. Like fixed capacitor 20, capacitor 30 is preferably of a feed-through variety. The other end of transmission line 12 is coupled to the walls of resonant cavity 16 by varactor diode 32. Trimmer capacitors 34, 36 and 38 are located in cavity 16 along transmission line 12 in the same manner as trimmer capacitor 24, 26 and 28.

As is well-known in the art, cavities 14 and 16 are aperture-coupled together by an opening 40 in the wall 42 dividing cavity 14 from cavity 16. A loop of wire 44 extending from cavity 14 to cavity 16 through opening 40 aids in the aperture coupling.

The preselector stage of the present invention further includes means for inductively coupling an unamplified radio frequency signal from the output of a UHF antenna 46 to the first resonant cavity 14 which means for inductive coupling comprises inductor 48 and resistor 50.

Inductor 48 is physically located inside cavity 14 adjacent transmission line 10 and is coupled to antenna 46. Resistor 50 couples one side of inductor 48 to housing 18 to bleed off undesirable static charge.

In accordance with the present invention, the preselector stage further includes circuit means between transmission lines 10 and 12 for providing the preselector stage with a substantially uniform bandwidth over the entire UHF frequency spectrum.

In a preferred embodiment, the circuit means comprises a "Bottom L" coupling including inductors 52, 54 and 56. Inductors 52 and 54 are connected in series between the one end of the first transmission line 10 coupled by capacitor 20 to the walls of cavity 14 and the one end of the second transmission line 12 coupled by capacitior 30 to the walls of cavity 16. Inductor 56 is connected between inductors 52 and 54 and capacitior 58 which, in turn, is connected to housing 18. Inductors 52, 54 and 56 provide inductive coupling between said one end of transmission lines 10 and 12 at the low frequency end of the UHF spectrum. As will be explained in more detail below, the inductive coupling provided by inductors 52, 54 and 56 is frequency dependent in that it is increasingly effective as the frequency of operation of the preselector stage decreases.

To selectively tune the resonant frequency of the preselector stage, a variable DC reverse bias is applied to varactor diodes 22 and 32 to selectively alter the capacitance of those diodes. The DC voltage path for reverse biasing varactor diode 22 comprises the series combination of resistor 60, decoupling resistor 62, inductor 56, inductor 52, feed-through capacitor 20 and transmission line 10. The DC voltage path for reverse biasing varactor diode 32 comprises the series combination of resistor 60, decoupling resistor 62, inductor 56, inductor 54, feed-through capacitor 30 and transmission line 12. The amount of reverse biasing across varactor diodes 22 and 32 is accordingly directly dependent on the magnitude of DC tuning voltage applied to resistor 60. Decoupling resistor 62 is employed to provide radio frequency decoupling between the first and second cavities 14 and 16 of the preselector and the other circuits in the varactor tuner.

In operation of the preselector stage of the present invention, unamplified UHF radio frequency signals received by antenna 46 are coupled to transmission line 10 by inductor 48. With capacitor 20 coupling one end of transmission line 10 to cavity 14 and varactor diode 22 coupling the other end of line 10 to cavity 14, transmission line 10 operates in a half-wave mode with peaks developed at each end of line 10 and a null developed intermediate the ends of line 10. The frequency to which line 10 is turned is dependent upon the capacitance of capacitor 20 and varactor diode 22. Ignoring the distributed capacitance of line 10, the resonant frequency of line 10 is proportional to the square root of the sum of the two capacitances divided by the product of the two capacitances. With the capacitance of capacitor 20 fixed, the resonant frequency of line 10 therefore varies inversely with the capacitance of varactor diode 22. The higher the capacitance of varactor diode 22, the lower in the UHF spectrum line 10 is turned. Conversely, the lower the capacitance of varactor diode 22, the higher in the UHF spectrum line 10 is tuned. Since the capacitance of varactor diode 22 is inversely proportional to the reverse bias across varactor diode 22, the frequency to which line 10 is tuned increases with increased reverse bias and decreases with decreased reverse bias.

With resistor 60 at 2.2K ohms, resistor 62 at 100 ohms, capacitor 20 at 12 picofarads, and varactor diode 22 exhibiting about 2 picofarads with a tuning voltage of approximately 25 volts and about 18 picofarads with a tuning voltage of approximately 1.5 volts, line 10 can be made to selectively tune over the entire UHF spectrum from channel 14 to channel 83.

In a similar manner, transmission line 12 is made to tune over the entire UHF spectrum with opening 40 providing aperture coupling between line 10 and line 12.

As mentioned above, as the capacitance of varactor diodes 22 and 32 increases (decreasing the tuned frequency of the preselector stage) the Q or quality of the dioes 22 and 32 decreases. However, by employing the varactor diodes 22 and 32 in a half-wave tuned circuit, the effect of the decreasing Q at the lower frequency operation is minimized. The reason is as follows: at the low end of the frequency spectrum, the capacitance of varactor diodes 22 and 32 greatly exceeds the fixed capacitance of capacitors 20 and 30. As a consequence, the high impedance point in lines 10 and 12 are developed at the lower capacitance of capacitors 20 and 30 causing varactor diodes 22 and 32 to essentially appear as AC shorts to housing 18. Accordingly, at low frequency, the half-wave tuning of the present invention establishes, in essence, a substantially quarter-wave standing wave. Thus, even though the Q of varactor diodes 22 and 32 decreases at the low end of the frequency spectrum when the capacitance of diodes 22 and 32 is maximized, the development of a high impedance point at the fixed capacitors 20 and 32 decreases the contribution of the varactor diode Q to the overall circuit Q and increases the contribution of the fixed capacitors Q to overall circuit Q, thereby maintaining high circuit Q throughout the UHF TV band.

It should be noted that this feature would not be possible in a tuner using quarter-wave tuned lines because one end of every quarter-wave line is permanently tied to the cavity walls.

By increasing the Q of the entire preselector circuit over the entire UHF spectrum, the resultant bandwidth of the preselector and, in general, the overall signal strength and gain of the preselector are maintained substantially uniform over the entire UHF spectrum.

However, although the employment of varactor diodes in the half-wave configuration of the present invention operates to increase the Q factor of the overall circuit, the Q of the circuit nevertheless tends to drop towards the low frequency end of the UHF spectrum when only aperture coupling is employed between cavities 14 and 16.

To compensate for signal loss at the lower end of the UHF spectrum and in accordance with the present invention, inductors 52, 54 and 56 augment the aperture coupling of opening 40 between lines 10 and 12 at the lower end of the UHF spectrum. Specifically, at the low end of the frequency spectrum the high impedance point of tuned lines 10 and 12 transfers from the varactor diodes to the lower capacitance of capacitors 20 and 30 as explained above. With the high voltage potential at capacitors 20 and 30, inductors 52, 54 and 56 become effective couplers of energy between line 10 and line 12. However, at the high end of the UHF spectrum, the capacitance of fixed capacitors 20 and 30 greatly exceeds the reduced capacitance of varactor diode 22 and 32. As a consequence, the high impedance point in line 10 and 12 moves to the lower capacitance of varactor diode 22 and 23 rendering fixed capacitors 20 and 30 effective AC shorts to housing 18 and thereby diminishing the coupling effect of inductors 52, 54 and 56. Thus, even though the Q of the tuned lines decreases at low frequencies, the available signal is more efficiently coupled between the lines 10 and 12 thereby maintaining a constant and substantially uniform bandwidth across the entire UHF spectrum.

Returning to the drawing, an oscillator means is shown for generating an oscillator signal.

In accordance with the present invention, the oscillator means incorporates a frequency control means comprising a halfwave tuned transmission line 64 mounted in an oscillator resonant cavity 66. One end of tuned line 64 is coupled to the walls of resonant cavity 66 by feedthrough capacitor 68. The other end of tuned line 64 is coupled to the walls of resonant cavity 66 by varactor diode 70. Trimmer capacitors 72, 74 and 76 provide capacitive coupling respectively between the walls of cavity 66 and transmission line 64.

To selectively tune the resonant frequency of line 64, a DC circuit is provided by blocking coil or choke 78 from resistor 60 through capactior 68 to line 64. Thus, as the tuning voltage increases, the reverse bias across varactor diode 70 increases, decreasing the capacitance of varactor diode 70 but increasing the resonance frequency of tuned line 64. Blocking coil 78 isolates radio frequency energy in cavity 66 from other sections of the tuner.

In accordance with the present invention, the oscillator means further includes a signal generating means comprising a transistor 80 coupled to said one end of tuned line 64. In a preferred embodiment of the invention, transistor 80 is physically located within resonant cavity 66. The emitter of transistor 80 is connected to the housing of cavity 66 by resistor 82 and the emitter is further connected to said one end of tuned line 64 by capacitor 84.

The collector of transistor 80 is capacitively coupled to said one end of tuned line 64 by capacitor 86. In a preferred embodiment of the invention, capacitor 86 is a feed-through capacitor physically coupled to the end of the feed-through capacitor 68 which extends into cavity 66. B+ is provided to the collector of transistor 80 through resistor 90.

The base of transistor 80 is biased by the voltage divider comprising the series combination of resistors 88 and 94 between the B+ source and housing 18. A bias voltage is applied to the base of transistor 80 by means of feed-through capacitor 92.

In operation, transistor 80 sets up a standing half-wave signal in tuned line 64 whose frequency is dictated by the reverse bias across, and hence capacitance of, varactor diode 70. At high operating frequencies (low capacitance in varactor diode 70) the Q of the circuit is high. However, as the frequency decreases, the Q of the varactor diode decreases and losses in the circuit increase. As explained above, these losses are minimized by the employment of a half-wave configuration in that at low frequencies, the high capacitance of varactor diode 70 in comparison to the capacitance of capacitor 68 renders varactor diode 70 an effective AC short to housing 80 and shifts the high impedance point of tuned line 64 to capacitor 68. This shift, as explained above, decreases the contribution of the varactor Q to the overall circuit Q and increases the contribution of the fixed capacitor Q to the overall circuit Q, thereby maintaining a high overall circuit Q throughout the UHF spectrum.

However, at low frequencies, some decrease in Q is experienced due to the the operation of varactor diode 70. This decreased Q is to a degree compensated for by the placement of the signal generating means adjacent the fixed capacitor end of tune line 64 which at low frequencies exhibits a high impedance.

Returning to the drawing, in a preferred embodiment of the invention, a resistor 98 is shown located inside cavity 66 coupled at one end to housing 18 with the other end passing through housing 18. Resistor 98 thereby provides a sample oscillator output which may be utilized to control and regulate the frequency of oscillation in tuned line 64 by means of a phase locked loop or counter circuit. Thus, resistor 98 provides a constant impedance for such a circuit and can drive channel selection circuitry (not shown) in the receiver to control the tuning voltage to varactors 22, 32 and 70.

In accordance with the present invention, mixer means is provided coupled to heterodyne the oscillator signal with a select radio frequency signal passed by the preselector stage to result in an intermediate frequency signal. Specifically, the preselector of the present invention results in a select radio frequency signal being established in cavity 16 by the operation of double tuned half-wave transmission lines 10 and 12. The oscillator signal is generated in cavity 66 by the operation of tune line 64 as described above.

In a preferred embodiment of the invention, the mixer means comprises mixer diode 100, feed-through capacitor 102, and inductor 104. Diode 100 is inserted in a aperture stamped in the partition between cavities 16 and 66 to accomplish mixing between the oscillator signal in cavity 66 and the radio frequency signal in cavity 16 in a manner described in my U.S. Pat. No. 3,299,360 issued Jan. 17, 1967 and assigned to the assignee of the present invention. Specifically, a lead 106 is connected from an internal wall of cavity 16 to diode 100 to provide coupling means for the RF signal in cavity 16 to diode 100.

In addition, a lead 108 runs from diode 100 into cavity 66, and back into cavity 16 through feed-through capacitor 102. Lead 108 operates to couple the oscillator signal in cavity 66 to diode 100. Lead 108 connects to inductor 104 which, in turn, is coupled to outside cavity 16 by lead 110. The inductively coupled radio frequency and oscillator signals are heterodyned in the diode 100 to provide a desired sum or difference frequency signal of intermediate frequency at line 110.

The resultant signal on line 110 is selected to be at the intermediate frequency for application to channel one of a VHF television tuner and the output on line 110 may in fact be directly coupled to the intermedite frequency input of a conventional VHF tuner.

However, in accordance with the teachings of the present invention, a preferred embodiment is disclosed wherein the intermediate frequency signal on line 110 is first amplified by a post gain control intermediate frequency amplifier 112 to control the magnitude of the intermediate frequency signal from mixer diode 100 to the input of a VHF tuner. The intermediate frequency signal from line 110 is coupled to amplifier 112 by choke 114 after filtering of the signal by inductor 116 between line 110 and housing 18. The use of a low noise, gain control IF amplifier stage between line 110 and the IF output of the tuner is particularly desirable when the UHF tuner of the present invention is used in conjunction with a varactor VHF tuner. In such a case, the output of amplifier 112 may be readily coupled directly to the IF input of a varactor VHF tuner. Furthermore, by employing a FET VHF input amplifier and a FET in amplifier 112, the AGC signal used to control UHF tuner amplifier 112 and a VHF tuner amplifier may be derived from the same source.

Thus, an output voltage is developed by the varactor UHF tuner of the present invention that is commensurate with VHF channel one input without the need of UHF radio frequency preamplifier that is costly and/or subject to producing cross-modulation and inter-modulation products. It is apparent that the varactor UHF tuner of the present invention attains combined economy and performance, heretofore not attainable by the prior art. Specifically, the present invention provides a comparatively low noise UHF tuner without the use of a radio frequency preamplifier, which maintains nearly uniform bandwidth throughout the UHF spectrum and which is compatible with either mechanical or varactor VHF tuners in which the VHF mixer is used as a UHF intermediate frequency amplifier.

While a particular embodiment of the present invention has been shown and described, it will of course be obvious to one skilled in the art that certain advantages and modifications may be effected without departing from the spirit of the invention, and accordingly, it is intended that the scope of the invention not be determined by the foregoing example but only by the scope of the appended claims.

What is claimed is:
1. A UHF varactor tuner comprising:
   preselector means for passing a select radio frequency signal, said preselector means including a housing containing resonant cavities, a plurality of transmission lines and a plurality of varactor diodes for providing variable half-wave tuning of said transmission lines, said transmission lines being contained in respective resonant cavities of said housing and being aperture intercoupled by aperture means in the walls of said resonant cavities;
   oscillator means for generating an oscillator signal;
   mixer means coupled to heterodyne said oscillator signal with said select radio frequency to result in an intermediate frequency signal; and
   said preselector means further including frequency dependent circuit means coupled between said tuned transmission lines and operative primarily at one end of the UHF band of frequencies to augment said aperture intercoupling and thereby provide said preselector means with a substantially uniform bandwidth over the entire UHF band.

2. The UHF varactor tuner recited in claim 1 wherein said preselector means further includes means for inductively coupling an unamplified radio frequency signal from a UHF antenna output to said plurality of tuned transmission lines.

3. The UHF varactor tuner recited in claim 2 wherein said tuner further comprises low noise post intermediate frequency gain control amplifier means coupled to control the magnitude of said intermediate frequency signal from said mixer means for application of said controlled intermediate frequency signal to an intermediate frequency signal input of a VHF tuner.

4. The UHF varactor tuner recited in claim 3, including a plurality of fixed capacitors and wherein said tuned transmission lines include first and second half-wave tuned transmission lines and said preselector means also includes first and second preselector resonant cavities having conductive walls and respectively housing said first and second tuned transmission lines, each tuned tranmission line being capacitively coupled to one end to a wall of its cavity by one of said varactor diodes, each tuned transmission line being further capacitively coupled at the other end thereof to another wall of its cavity by one of said fixed capacitors, said first and second preselector resonant cavities having aperture coupling therebetween to form a double tuned half-wave preselector.

5. The UHF varactor tuner recited in claim 4 wherein said frequency dependent circuit means comprises inductive coupling between said other ends of said first and second half-wave tuned lines.

6. The UHF varactor tuner recited in claim 5 wherein said oscillator means includes a frequency control means comprising a third half-wave tuned line, an oscillator resonant cavity having conductive walls and an oscillator varactor diode, said third tuned line being capacitively coupled at one end to the walls of said oscillator resonant cavity and said third tuned line being coupled at the other end to the walls of said oscillator resonant cavity by said oscillator varactor diode.

7. The UHF varactor tuner recited in claim 6 wherein said oscillator means further includes a signal generating means comprising a transistor coupled to said one end of said third half-wave tuned line.

8. The UHF varactor tuner recited in claim 7 wherein said mixer means comprises a diode mixer coupled between said second preselector resonant cavity and said oscillator resonant cavity.

9. A constant bandwidth UHF tuner comprising:
   first and second resonant cavities, two transmission lines, two capacitors, and two varactor diodes, said transmission lines being housed respectively in said first and second resonant cavities in half-wave tuning configurations with one of said capacitors connected between a first end of each line and each respective cavity and with one of said varactor diodes connected between a second end of each line and each respective cavity;
   variable voltage means for biasing said varactor diodes to tune said lines to a select radio frequency signal;
   radio frequency coupling means for introducing an unamplified ratio frequency signal to said first cavity;
   aperture coupling means between said first and second cavities;
   oscillator means for generating an oscillator signal;

mixer means coupled to heterodyne said oscillator signal with said select radio frequency signal as passed by said resonant cavities to result in an intermediate frequency signal; and frequency dependent coupling means inductively linking together said first end of said transmission line in said first cavity and said first end of said transmission line in said second cavity during operation of said tuner at the lower portions of the UHF frequency spectrum to provide said tuner with a substantially uniform bandwidth over the entire UHF frequency spectrum.

10. The UHF tuner recited in claim 9 wherein said oscillator means comprises:

a third oscillator resonant cavity, a third transmission, third capacitor and a third varactor diode, said oscillator line mounted in said oscillator resonant cavity with said oscillator transmission line coupled at a first end to said oscillator resonant cavity by said capacitor and said oscillator transmission line coupled at a second end to said oscillator resonant cavity by said third varactor diode;

a signal generating means comprising a transistor coupled to said first end of said oscillator line; and said variable voltage means biasing said third varactor diode to tune said oscillator means to a select oscillator frequency signal.

11. The UHF tuner recited in claim 10 wherein said mixer means comprises a diode mixer coupled between said second resonant cavity and said oscillator resonant cavity.

12. The UHF tuner recited in claim 11 wherein said tuner further comprises low noise post intermediate frequency gain control amplifier means coupled to control the magnitude of said intermediate frequency signal from said mixer means for application of said controlled intermediate frequency signal to an intermediate frequency signal input of a VHF tuner.

* * * * *